US006519270B1

United States Patent
Kim et al.

(10) Patent No.: US 6,519,270 B1
(45) Date of Patent: Feb. 11, 2003

(54) COMPOUND CAVITY REFLECTION MODULATION LASER SYSTEM

(75) Inventors: Hyung B. Kim, Kanata (CA); Jin J. Hong, Cupertino, CA (US)

(73) Assignee: Bookham Technology PLC, Oxon (GB)

(*) Notice: Subject to any disclaimer, the term of this patent is extended or adjusted under 35 U.S.C. 154(b) by 0 days.

(21) Appl. No.: 09/409,036

(22) Filed: Sep. 29, 1999

(51) Int. Cl.[7] .................................................. H01S 3/10
(52) U.S. Cl. ...................... 372/28; 372/20; 372/29.014; 372/50
(58) Field of Search ............................ 372/28, 46, 20, 372/50, 45, 102; 359/344; 385/122, 14

(56) References Cited

U.S. PATENT DOCUMENTS

| | | | | |
|---|---|---|---|---|
| 4,899,360 A | * | 2/1990 | Fujita et al. | 372/50 |
| 4,961,198 A | | 10/1990 | Ishino et al. | 372/50 |
| 5,022,730 A | * | 6/1991 | Cimini et al. | 350/96.13 |
| 5,568,311 A | * | 10/1996 | Matsumoto | 359/344 |
| 5,796,902 A | * | 8/1998 | Bhat et al. | 385/122 |
| 5,936,994 A | * | 8/1999 | Hong et al. | 372/96 |

FOREIGN PATENT DOCUMENTS

| | | | | |
|---|---|---|---|---|
| EP | 0532816 A1 | 3/1993 | | G02B/6/12 |
| EP | 0903820 A2 | 3/1999 | | H01S/3/103 |
| EP | 0911927 A1 | 4/1999 | | H01S/3/103 |
| GB | 2174505 A | 11/1986 | | G02F/1/01 |
| JP | 58207388 | 11/1983 | | H01S/3/18 |

OTHER PUBLICATIONS

"Etching–Through Strongly Gain–Coupled (ET–SGC) Coolerless (–40°—85°C) Ridge Waveguide MQW DFB Lasers", J. Hong et al., Third Optoelectronics and Communications Conference (OECC '98) Technical Digest, Jul. 1998, Makuhari Messe.

"Impact of Random Facet Phases on Modal Properties of Partly Gain–Coupled Distributed–Feedback Lasers", J. Hong et al., *IEEE Journal of Selected Topics in Quantum Electronics*, vol. 3, No. 2, Apr. 1997, pp. 555–568.

* cited by examiner

*Primary Examiner*—Paul Ip
*Assistant Examiner*—Armando Rodriguez
(74) *Attorney, Agent, or Firm*—Foley & Lardner

(57) ABSTRACT

The invention relates to compound cavity optical reflection modulation laser system providing frequency modulation of laser light by phase induced effective reflection modulation of the laser rear facet. The system includes a single mode gain coupled DFB laser integrated with a passive waveguide section to form a compound cavity modulation system. The waveguide includes a multiple quantum well region which is reverse biased to utilize the quantum Stark effect for voltage controlled refractive index modulation, thus providing phase modulation of the laser light. The phase modulated light is fed back to the laser to interfere with the light generated within the laser and to form the output light generated from the compound cavity. The interference effects cause modulation of the effective complex reflection of the rear laser facet which results in frequency modulation of the output light. If required, the frequency modulated light (FM) may be converted into intensity modulated (IM) light by using an additional narrow band optical filter, e.g. Mach-Zehnder interferometer.

9 Claims, 10 Drawing Sheets

COMPOUND CAVITY REFLECTION MODULATION LASER SYSTEM

FIELD OF INVENTION

The invention relates to optical modulators, and in particular, to a compound cavity reflection modulation laser system providing frequency modulation.

BACKGROUND OF THE INVENTION

Fiber optics communication systems require compact light emitting sources capable of generating single mode, narrow linewidth radiation in the 1.3–1.6 μm wavelength range. Some of the existing semiconductor lasers, for example, InGaAsP DFB lasers, can meet requirements for high power and proper wavelength operation. However, the ever increasing demand for network bandwidths, requiring narrower channel spacing in dense wavelength division multiplexing (DWDM) optical networks, poses a serious technological challenge on modulation schemes used in optical communication systems.

Nowadays there are two major types of modulation techniques which are widely used in the optical communication industry: a direct amplitude modulation of semiconductor lasers, and an external amplitude modulation. In the direct modulation, the electrical signal drives the laser from the level which is slightly above the threshold current to the level which is well above the threshold current to obtain direct intensity modulation. In this type of modulation, the frequency chirp is the dominant factor which determines the system performance and limits its practical applications.

In contrast, the external modulation can suppress the frequency chirp to a large extent. However, since this type of modulation requires a modulator to be placed in front of the laser, it results in substantial absorption of the output laser power within the modulator. The absorbed power generates heat that impacts the reliability of the external modulator and/or results in the frequency chirp of the laser when the laser and the modulator are integrated together. It is also either bulky or expensive to isolate the two components or to integrate them together.

Another well known modulation technique, the frequency modulation (FM) technique, is known to give much better receiver sensitivity due to its immunity to the noise added into the transmitting channel in various stages of communication process. In the optical domain, FM schemes can be implemented in different ways, none of them unfortunately having found wide practical applications. The main reasons, limiting performance of FM, are associated with a limited speed of modulation determined by the relaxation frequency of lasers and a significant amount of thermal chirp resulted from the relatively small current modulation.

There is another technique for providing optical modulation known as a reflection modulation technique. In this configuration, an output light of a semiconductor laser is sent to a piece of passive waveguide whose facets are anti-reflection coated or left as cleaved. The laser is fully isolated from the waveguide modulator by means of an optical circulator. By modulating the passive waveguide, the round trip phase inside the passive waveguide section is changed, and the entire waveguide serves as a Fabry-Perot (FP) etalon providing either transmission or reflection. Thus, the semiconductor laser is totally isolated from the entire modulation process and therefore is not affected by the external modulation operation. The resulting signal is directly amplitude modulated (AM) only. The problems associated with this scheme are similar to that of other types of external AM modulation. It is bulky in size because of the requirement to have the optical isolator or circulator, and since the reflection of the beam may partially come back into the laser, it needs to maintain an excellent isolation and beam redirection during operation.

Accordingly, there is a need in industry for the development of new schemes for optical modulation which would eliminate frequency chirps associated with known modulation schemes while maximizing the output optical power.

SUMMARY OF THE INVENTION

It is therefore an object of the present invention to provide a system for modulating laser light which would avoid the afore-mentioned problems.

Thus, according to one aspect of the present invention there is provided a compound cavity reflection modulation laser system, comprising:

a single wavelength laser, having a first cavity defined by a front laser facet and a rear laser facet;

a phase modulation element having a second cavity defined by a front element facet and a rear element facet, the first and second cavities forming a compound cavity of the laser system defined by the front laser facet and the rear element facet;

the phase modulation element receiving light generated in the first cavity and providing phase modulation of said light to produce phase modulated light, the phase modulated light being fed back into the first cavity so as to provide interference of light formed in the first and second cavities, the interference effects resulting in complex reflection modulation of the rear laser facet, the reflection modulation providing frequency modulation of the output light.

Beneficially, the front element facet is attached to the rear laser facet so that the first and second cavities are aligned along the same line. The phase modulation element is a passive waveguide which is preferably a reverse biased semiconductor waveguide comprising a multiple quantum well region. The laser and the modulation element are hybrid integrated into the system, with the monolithic integration of the laser and the modulation element on the same chip being an alternative design. Advantageously, the laser is a single mode semiconductor DFB laser comprising a multiple quantum well structure. Preferably the DFB laser is a gain-coupled laser or loss-coupled laser, conveniently comprising a complex coupled grating formed by etching grooves directly through the multiple quantum well structure. Alternatively, the laser may be any other known single wavelength semiconductor laser generating light within the required range of wavelengths.

Conveniently, each of the element facets is one of the cleaved facet and high reflection coated facet. Alternatively, the front element facet and the rear laser facet may be either anti-reflection coated or left as cleaved.

Optionally, the system may further comprise means for frequency modulation (FM) into intensity modulation (IM) conversion, e.g. semiconductor or fiber Mach-Zehnder interferometer, or a band pass filter.

According to another aspect of the invention, there is provided a reflection modulation compound cavity laser system, comprising:

a single mode DFB semiconductor laser, having a first cavity defined by a front laser facet and a rear laser facet;

a phase modulation element, the element being a passive waveguide having a second cavity defined by a front element facet and a rear element facet, the first and second cavities forming a compound cavity for the laser system defined by the front laser facet and the rear element facet so that the rear laser facet and the front element facet are attached to each other and the first and second cavities are aligned along same axis;

the phase modulation element receiving light generated in the first cavity and modulating said light in the second cavity to produce phase modulated light, the phase modulated light being fed back into the first cavity so as to provide modulation of the effective complex reflection of the rear laser facet due to interference of light from the first and second cavities, the reflection modulation resulting in frequency modulation of the output light.

The reflection modulation system described above offers many unique features over other known modulation schemes by providing much higher output power, eliminating thermal and other types of frequency chirps, requiring lower drive voltage in the modulation element, providing higher device yield in large scale production and being suitable for high speed and long haul data transmission.

BRIEF DESCRIPTION OF THE DRAWINGS

The invention will now be described in greater detail with reference to the attached drawings, in which.

DESCRIPTION OF THE PREFERRED EMBODIMENTS

Figure 1:
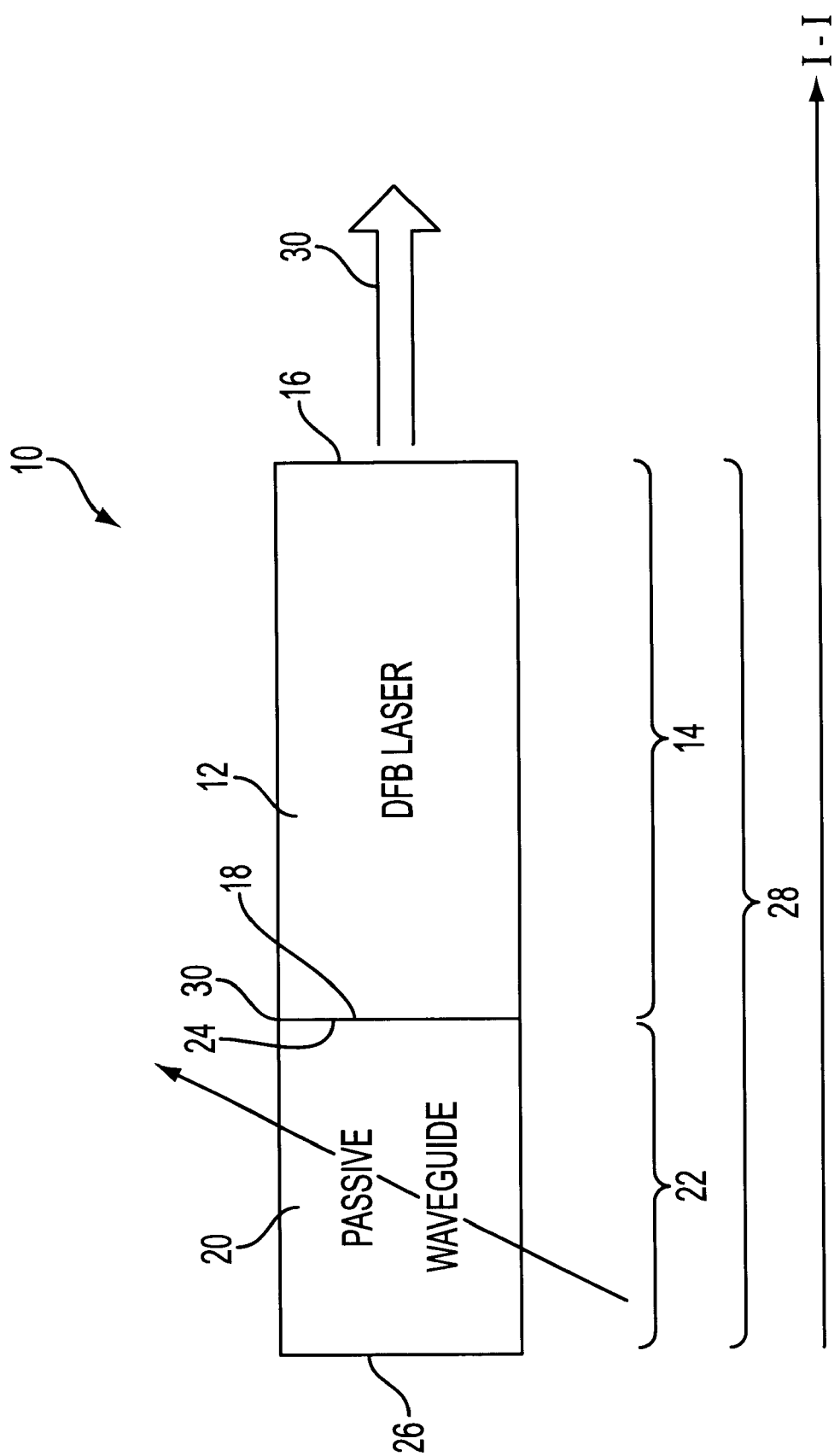
FIG. 1 is a schematic diagram of compound cavity reflection modulation system according to an embodiment of the invention.

A compound cavity reflection modulation system 10 according to an embodiment of the invention is shown in FIG. 1. It comprises a single mode DFB laser 12 having a first cavity 14 defined by a front laser facet 16 and a rear laser facet 18, and a phase modulation element represented by a passive waveguide 20 having a second cavity 22 defined by a front element facet 24 and a rear element facet 26. The first and second cavities 14 and 22 form a compound cavity 28 of the laser system 10 defined by the front laser facet 16 and the rear element facet 26. The facets 16 and 18 of the laser are anti-reflection (AR) coated, the element facet 24 is AR coated, and the element facet 26 is left as cleaved. The front element facet 24 of the waveguide 20 is attached to the rear laser facet 18 at the butt-joined point 30 to form a compact hybrid system 10 so that the first and second cavities 14 and 22 are aligned along same line designated by numeral I—I in FIG. 1. The laser 12 generates light which is partially reflected from the rear laser facet 18, and the rest is directed into the second cavity of the waveguide 20. The waveguide 20 provides phase modulation of the received light and operates as a Fabry-Perot etalon. The phase modulated light is fed back into the first cavity 14 where light from the first and second cavities 14 and 22 interfere. The interference effects provide modulation of the complex reflection of the rear laser facet 18 which results in frequency modulation of the output light 30 generated from the compound cavity 28 as will be described in detail below.

Figure 2:
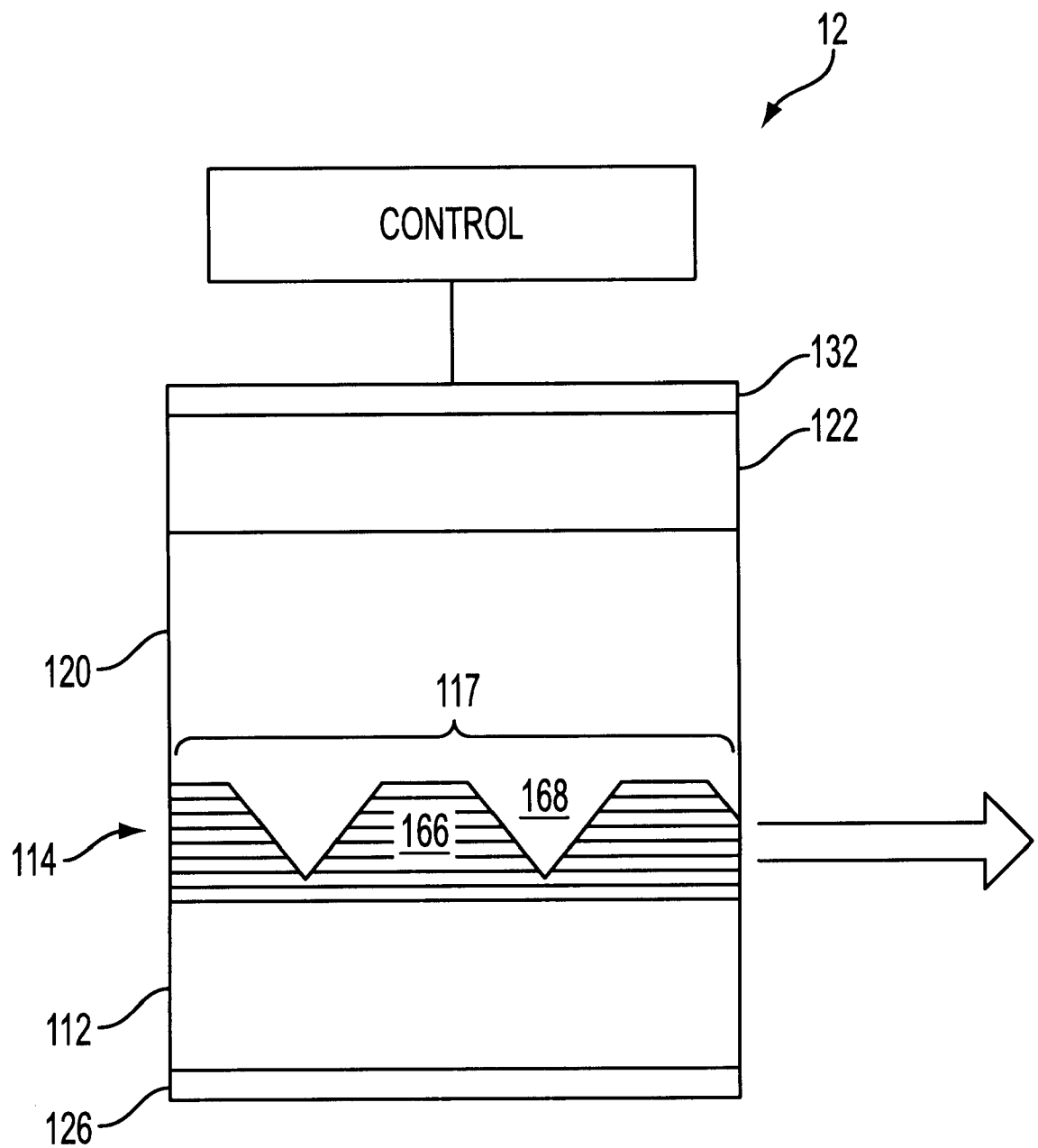
FIG. 2 shows a schematic cross sectional view of the laser incorporated into the system of FIG. 1.

A schematic cross section through the DFB laser 12 is shown in FIG. 2. The laser 12 is formed on a substrate 112 providing a first confinement region, an active medium 114 comprising a multiple quantum well structure 116 with a grating 117 formed therein, and an overlying confinement region 120. Means for excitation the laser are formed thereon, and include contact to the substrate 126, current confining ridge 122, and a contact electrode 132 defined on the ridge for current injection into the laser. The grating 117 is made by periodic etching grooves through the active medium 114, the depth of etching being defined so as to provide a substantial insensitivity of each laser to the external feedback and random facet variations and thereby ensuring no substantial interaction between the laser 12 and the waveguide 20 as will be described below.

Figure 3:
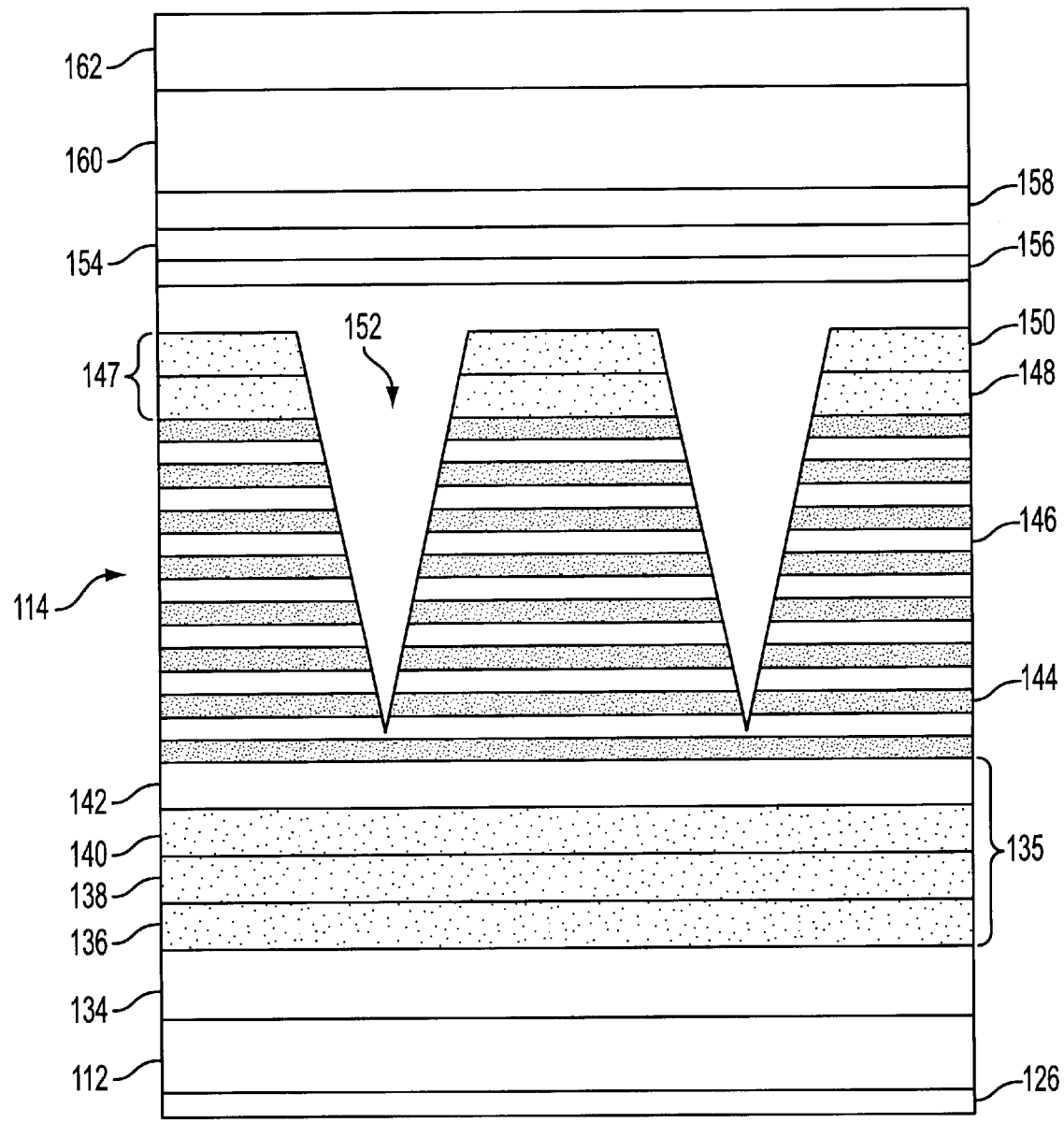
FIG. 3 shows a detailed cross sectional view of the laser of FIG. 2.

The structure of the laser 12 is shown in more detail in FIG. 3, which illustrates an oblique cross-sectional view through the laser 12. The DFB semiconductor laser 12 is fabricated from Group III–V semiconductor materials, and comprises a heavily N-doped InP substrate 112, on which an N-doped InP buffer layer 134 of 1.5 $\mu$m thickness is defined. The first separate confinement region 135, consisting of four confinement layers 136, 138, 140 and 142 of N-doped InGaAsP with energy band gaps corresponding to wavelengths of 1.0 $\mu$m, 1.1 $\mu$m, 1.15 $\mu$m and 1.20 $\mu$m respectively, is provided over the buffer layer 134. The thickness of each confinement layer is 20 nm, and the confinement layer 136 corresponding to the 1.0 $\mu$m wavelength is adjacent to the buffer layer 134. The active region 114 overlies the confinement region 135 and comprises a multiple quantum well (MQW) structure 116 which includes four to eight 1% compressively strained N-doped, or undoped InGaAsP quantum wells 144, each being 5 nm thick, separated by several undoped or P-doped InGaAsP unstrained barriers 146 with a band gap corresponding to wavelength of 1.20 $\mu$m, each barrier being 10 nm thick. The alloy composition and layer thickness of the MQW structure 116 are tailored to have specific band gap energies to provide for lasing at a required wavelength. Increasing the number of quantum wells provides higher gain per unit length of the laser cavity. The band gap of the quantum well structure described above provides a lasing wavelength of the device at about 1.55 $\mu$m. A second separate confinement region 147, consisting of two P-doped InGaAsP confinement layers 148 and 150, having energy band gaps corresponding to 1.1 μm and 1.20 μm wavelengths respectively, is grown on top of the MQW active region 114, each layer being 20 nm thick.

As mentioned above, grating 117 is defined by periodically etched grooves through the active medium 114. The pitch of the groove of the grating is selected so as to define a first order grating for the lasing Bragg wavelength. Grating 117 has a period comprising a first portion 166 and a second portion 168 as shown in FIG. 2. The second portion 168 is V-shaped and characterized by substantial etching away almost all quantum wells, namely, seven out of eight quantum wells. The more quantum wells are etched away from the portion, the less is the photon generation in the section. Thus, a deep etching through the second portion 168 provides no substantial photon emission in this portion, and as a result, provides insensitivity of the laser to facet phase and reflectivity variations. The details have been discussed in publication by J. Hong, T. Makino, C. Blaauw et. al. "Etching-Through Strongly gain-Coupled (ET-SGC) Coolerless (−40°–85° C.) Ridge Waveguide MQW DFB Lasers" in Third Optoelectronics and Communications Conference (QECC'98) Technical Digest, 14B1–4, July 1998, Makuhari Messe, and in the U.S. patent application Ser. No. 08/998, 071 to Jin Hong et. al. filed on Dec. 24, 1997.

A P-doped InP layer 152, fills the grooves of the gratings. A 3 nm thick etch stop layer 154 of P-doped InGaAsP, surrounded by P-doped InP buffer layer 156 at the bottom and P-doped InP buffer layer 158 at the top is formed next, the buffer layers being 100 nm and 200 nm thick correspondingly. An upper cladding layer 160 of P-type InP, followed by a highly doped P-type capping layer 162 of InGaAs for contact enhancement, having thickness 1600 nm and 200 nm correspondingly, complete the structure. A bottom electrical N-contact 126 is provided at the bottom of the substrate 112. Corresponding means (not shown) for controllably varying current injection, changing temperature of the laser, and/or tuning the laser wavelength are provided.

Figure 4:
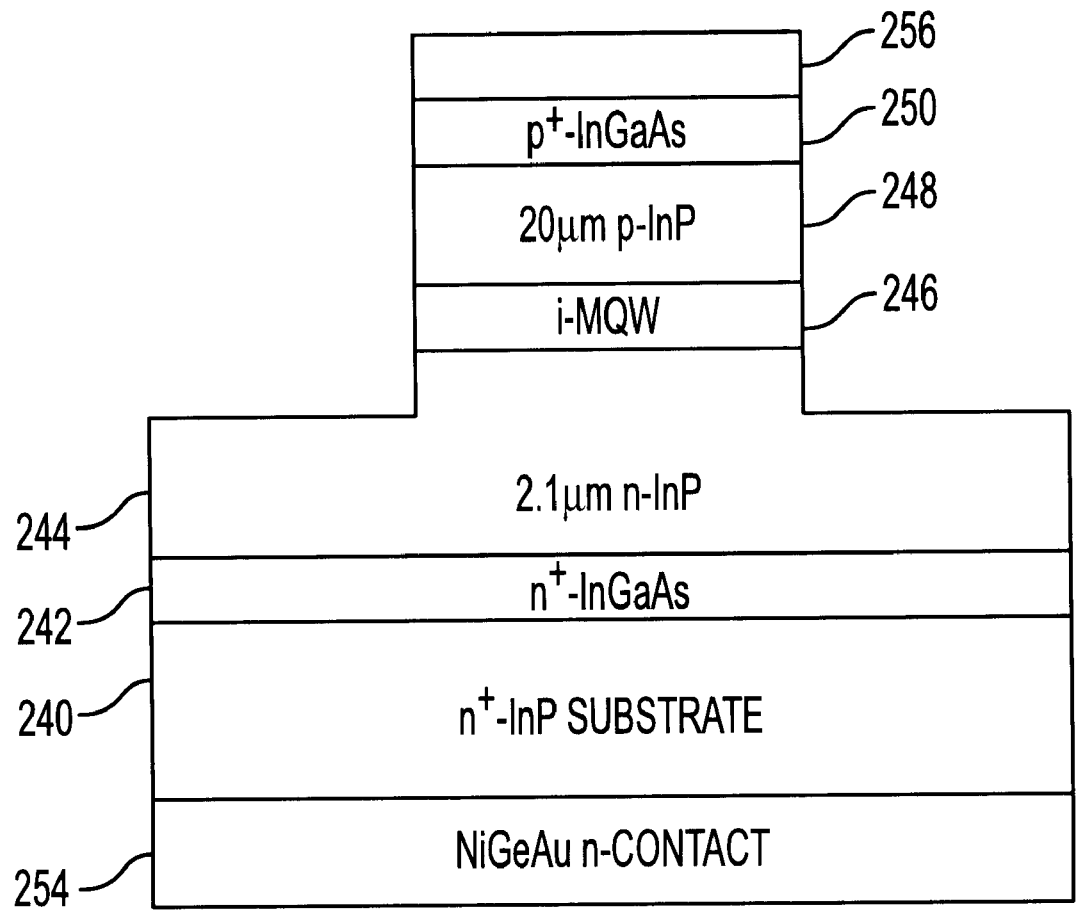
FIG. 4 is a schematic cross sectional view of the passive waveguide.

The cross-section structure of the passive waveguide 20 is shown in FIG. 4. It includes a N+-doped InP substrate 240 on which is grown a thin InGaAs absorbing layer 242. Next a N-type InP cladding layer 244 is grown followed by the multiple quantum well (MQW) region 246. MQW 246 in the preferred embodiment is in an intrinsic region comprising a plurality of quaternary (InGaAsP) layers (not shown) separated by InP barrier layers (also not shown). Although a multiple quantum well is described in terms of a preferred embodiment, a single quantum well may also be used. A P-type InP cladding layer 248 is grown on top of the MQW 246, and finally a P+-doped InGaAs layer 250 which serves as a contact enhancement layer and as an absorbing layer complete the structure. P-type contact 256 is formed on top of layer 250, and N-type contact 254 is formed on the substrate side. The bonding pads, wells and waveguide ridges are simultaneously etched through the MQW layer (not shown). The waveguide InGaAsP/InP material is characterized by a non-linear electro-optic effect which provides change of the refractive index in the material under applied voltage, which, in turn, modifies the phase of the light propagating through the waveguide. Other examples of such materials are III–V alloys, e.g. AlGaAs/GaAs, as well as certain II–VI alloys. The layers of the waveguide are grown by known epitaxial techniques such as Metal Organic Chemical Vapour Deposition (MOCVD).

In the preferred embodiment of the invention, the laser 12 and the modulation element 20 are hybrid integrated together and aligned optically to have a shared optical path and to provide mutual injection of light into each other. For the hybrid integration, the two elements are fabricated and selected independently to their own specifications, and then are physically aligned and put together either in physical contact at the contacting facets or within a close proximity of each other in the range of a fraction of a micrometer. Both facets 16 and 18 of the DFB laser 12 are anti-reflection coated with a low facet reflectance in the range of less than 0.1% to several percent. The front element facet 24 of the waveguide is also anti-reflection coated with a similar low reflectance. The AR-coated front element facet 24 of the waveguide is butt-joined with the AR-coated rear laser facet 18 of the laser 12. The rear element facet 26 of the waveguide 20 is preferred to be left as cleaved or coated with high reflection coating (HR), depending on the system requirements.

Once the laser 12 and the modulation element 20 are integrated together, the reflection modulation system 10 is built.

The system 10 operates in the following manner. It is known that gain/loss coupled lasers have an advantage over other DFB lasers in suppressing one of the two originally degenerated Bragg modes. Additionally, the gain coupled laser 12, shown in FIGS. 2 and 3, provides a further advantage of being insensitive to effective facet and reflectivity variations due to etching substantially all quantum wells away from one section of the grating period as discussed above. It means that the laser 12 ensures no switching between the Bragg modes and provides a stable operation at the dominant Bragg mode within a wide range of facet phase and reflectivity variations. The lasing mode of such a laser is therefore determined rather by an internal built-in and distributed mode selection structure, i.e. by the grating defined by deep etching, than by the external facet phase and coating asymmetry. When arranged in combination with other elements, e.g. the passive waveguide 20 as shown in FIG. 1, such a laser ensures substantially independent operation and no substantial interaction with the adjacent elements. More detail may be found in the article by J. Hong et. al. "Impact of Random Facet Phases on Modal Properties of Partly Gain-Coupled DFB Lasers," IEEE Journal of Selected Topics in Quantum Electronics, vol. 3, No. 2, pp. 555–568, April 1997.

Figure 5A:
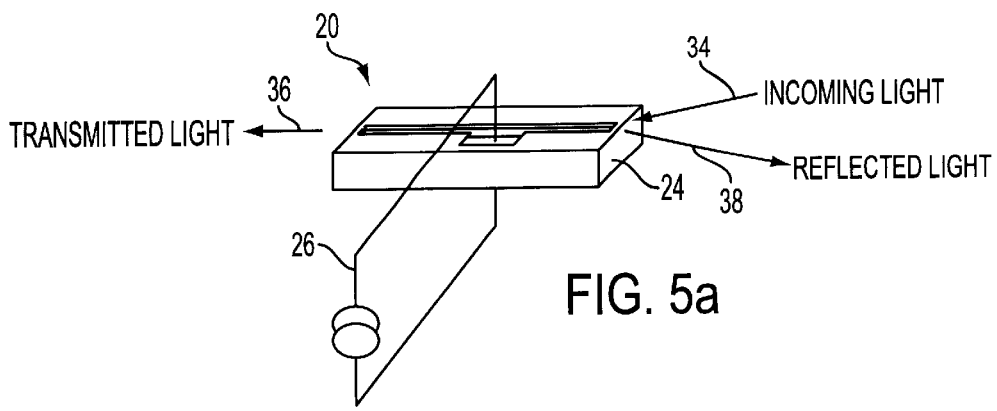
FIG. 5a is a schematic view of the passive waveguide.
Figure 5B:
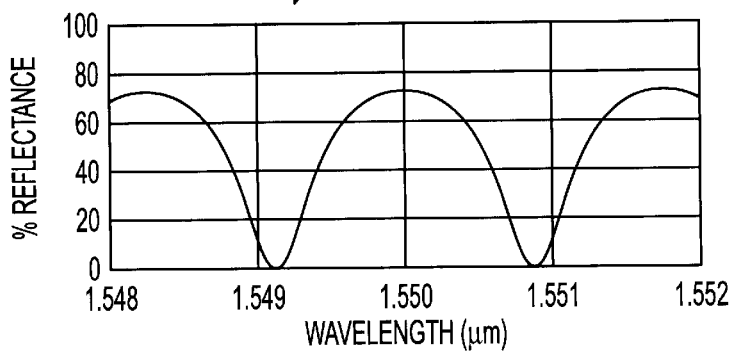
FIGS. 5b, 5c and 5d illustrate the reflectance and transmittance functions of the waveguide, and a phase of the reflected light respectively.
Figure 5C:
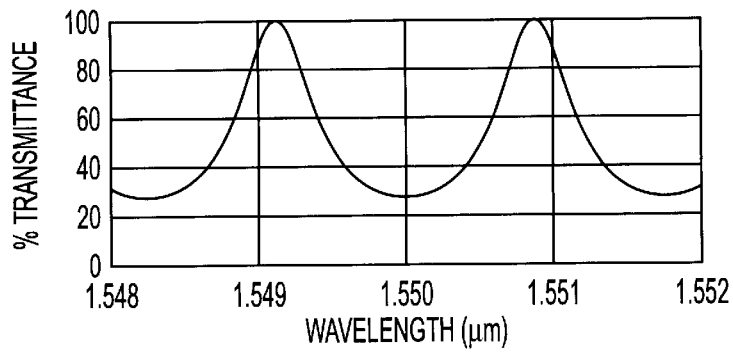
Figure 5D:
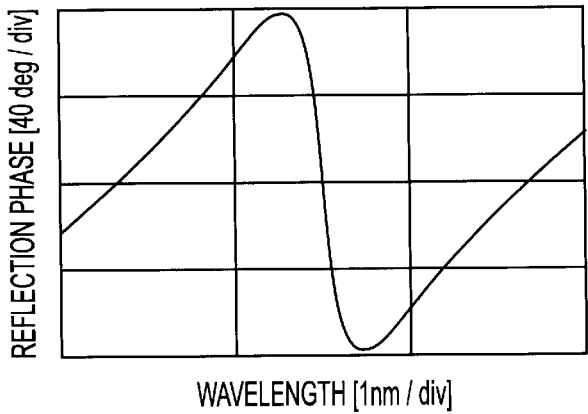

The passive waveguide 20 is modulated at high speed by driving a reverse signal voltage. The voltage modulation causes the refractive index modulation in the passive waveguide, which, in turn, translates into the round-trip optical phase modulation. The waveguide 20 operates as a Fabry-Perot etalon, receiving an incoming light 34 from the DFB laser 12 and providing phase modulated transmitted and reflected light 36 and 38 respectively as illustrated in FIG. 5a. Corresponding reflectance and transmittance diagrams of the etalon (waveguide 20) are shown in FIGS. 5b and 5c, with the phase dependence of the reflected light 38 being illustrated in FIG. 5d where the length of the waveguide has chosen to be 300 microns. Since the rear element facet 26 of the passive waveguide 20 is a broad reflector which forms a compound cavity 28 with the DFB laser cavity 14, the effective reflection coefficient of the rear laser facet 18 is therefore a complex factor, whose complex amplitude is determined by reflection coefficients of the rear element facet 26 and rear laser facet 18, and the round-trip phase modulation in the passive waveguide 20. This is mainly due to the constructive and destructive interference effects caused by the attachment of the external passive cavity 22 to the laser cavity 14. The modulation of the effective reflectivity of the laser rear facet 18 perturbs the laser characteristics and pulls the lasing frequency away from its stationary frequency. Since the DFB laser 12 is substantially insensitive to random facet phase and reflectivity variations, the single mode properties of the laser are well maintained during operation. It is assumed that the frequency modulation range is within the stable operation range of the laser. In such an arrangement, the DFB laser can be biased at high injection current level to obtain high output power and high intrinsic relaxation frequency ensuring high speed frequency modulation for the compound cavity laser.

Figure 6A:
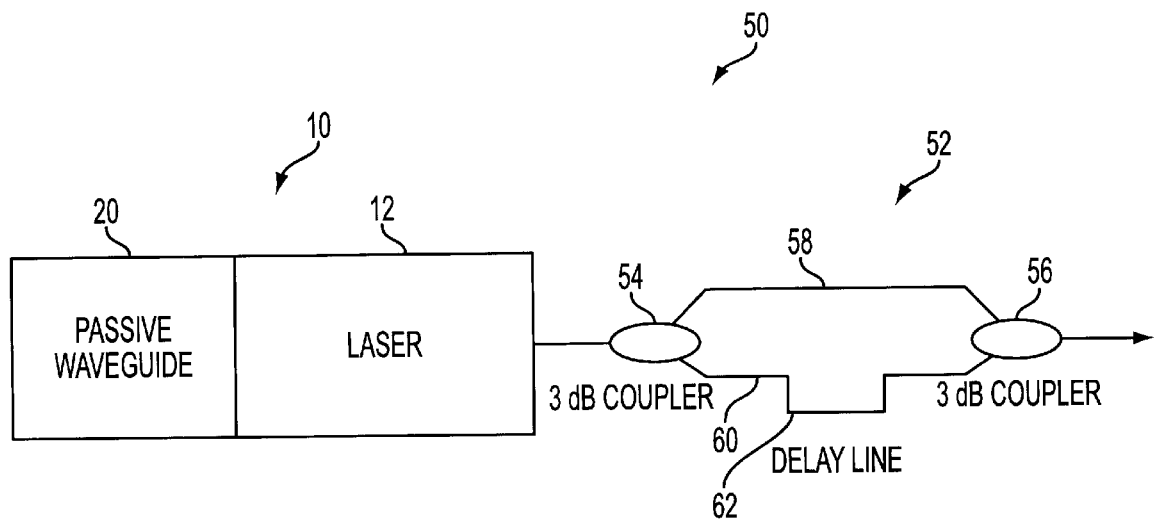
FIGS. 6a and 6b show a schematic view of a frequency modulation (FM) to intensity modulation (IM) system comprising the reflection modulation system of FIG. 1 combined with Mach-Zehnder interferometer, and the corresponding transfer function of the interferometer respectively.
Figure 6B:
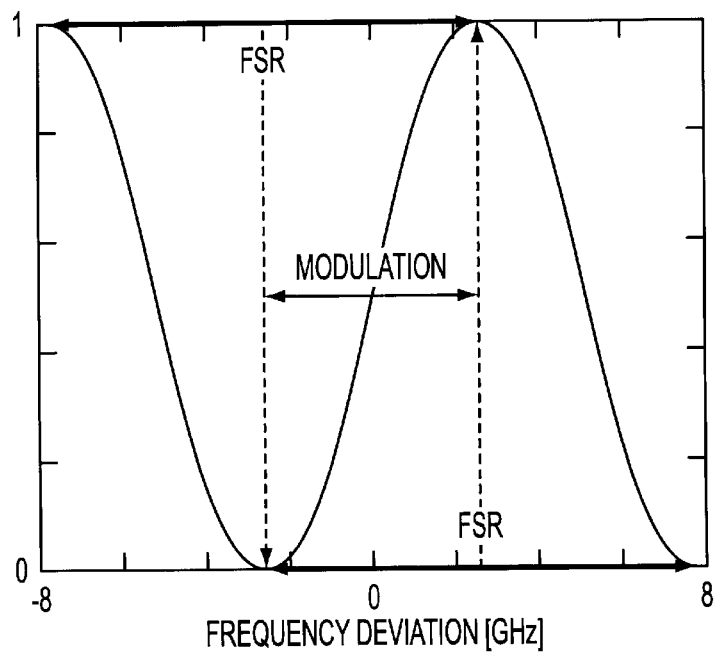

Thus, the reflection modulation system 10 described above provides phase induced frequency modulation (FM) of the laser light. For high speed and long haul DWDM transmission, an additional FM to intensity modulation (IM) conversion of the signal before transmitting through fibers is required. Usually it is done by means of a narrow band filter, a variety of them being commercially available. A fiber based Mach-Zehnder (MZ) interferometer has been used as FM to IM converter in this invention. Accordingly, FIG. 6a illustrates a modulation system 50 comprising the reflection modulation system 10 combined with the MZ interferometer 52. The fiber based MZ interferometer 52 operates as FM to IM converter, and it is made so as to provide a response of the etalon type and to exhibit sufficient free spectral range (FSR). The FSR and transfer function of the converter are illustrated in FIG. 6b. The MZ interferometer 52 has two 3 dB optical couplers 54 and 56 at the input and the output ports of the MZ arms respectively. The two interferometer arms 58 and 60 are intentionally made unequal in length by introducing a delay line 62 so as to provide a desired phase shift between the arms resulted in the desired free spectral range, e.g. equal to the given channel spacing in a DWDM system.

Figure 7:
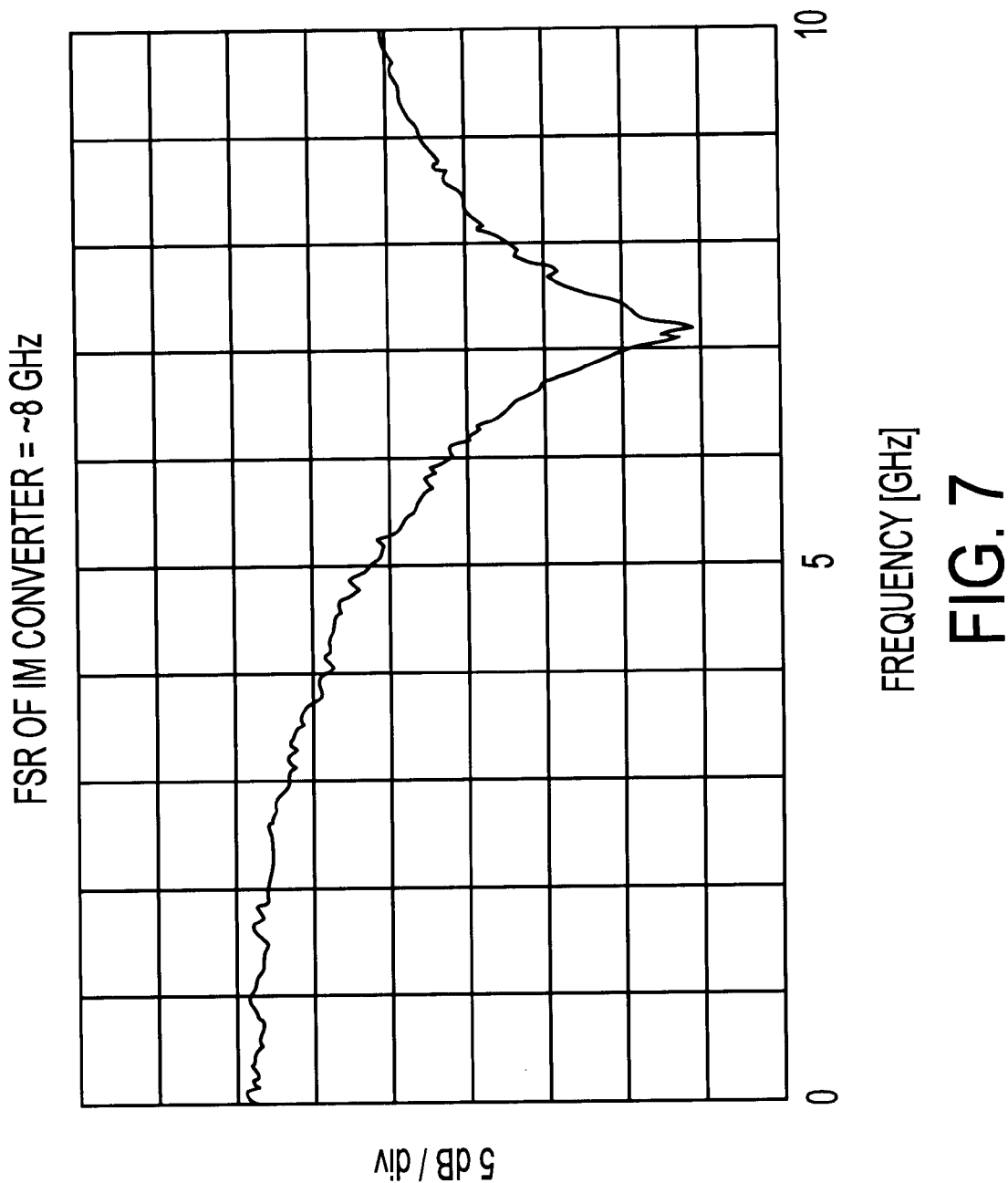
FIG. 7 shows signal modulation response for the system of FIG. 6a when the interferometer has a free spectral range (FSR) of about 8 GHz.
Figure 8:
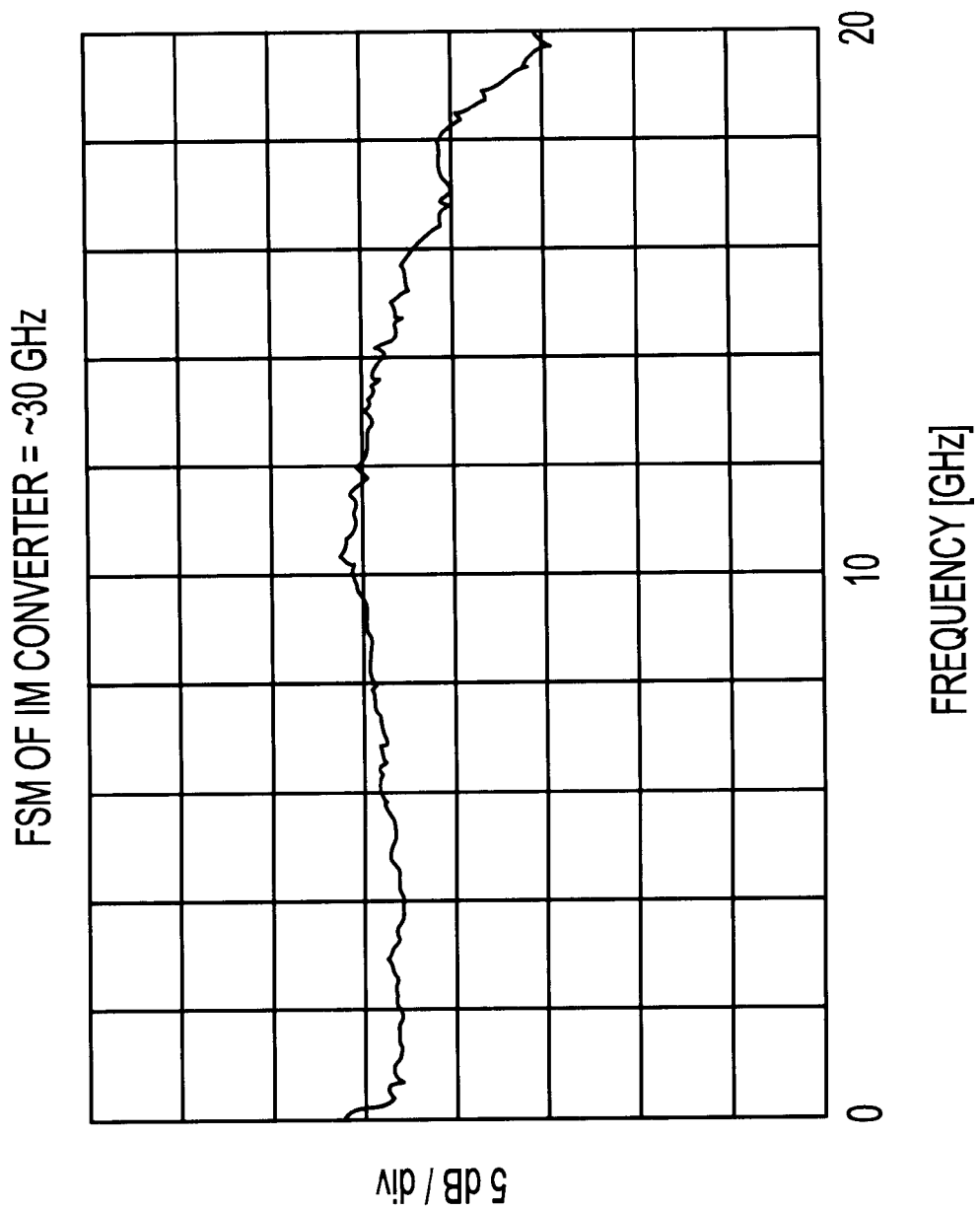
FIG. 8 shows signal modulation response for the system of FIG. 6a when the interferometer has a free spectral range of about 30 GHz.

FIG. 7 shows a signal modulation response for the system 50 of FIG. 6a including the interferometer (converter) 52 which has a free spectral range (FSR) of about 8 GHz. It is seen that the maximum transmitted signal bit rate is limited in this case by the FSR of the converter 52, being equal approximately 8 Gb/s. In contrast, FIG. 8 shows a signal modulation response for the system 50 of FIG. 6a including the converter 52 which has a free spectral range of about 30 GHz. It is seen that in this case the response is substantially flat within a wide range of frequencies (up to at least 20 GHz) which means that maximum transmitted bit rate is limited by the signal itself and not by the converter 52.

Figure 9A:
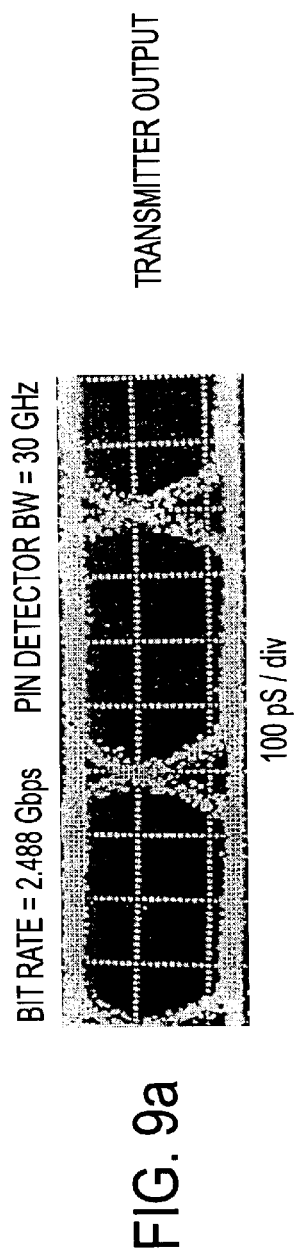
FIGS. 9a, 9b and 9c show a transmitted back to back output after the system of FIG. 6a and corresponding eye diagrams received at 2.5 Gb/s after additional 695 km of non-dispersion-shifted fibers (NDSF) and after OC-48 receiver respectively.
Figure 9B:
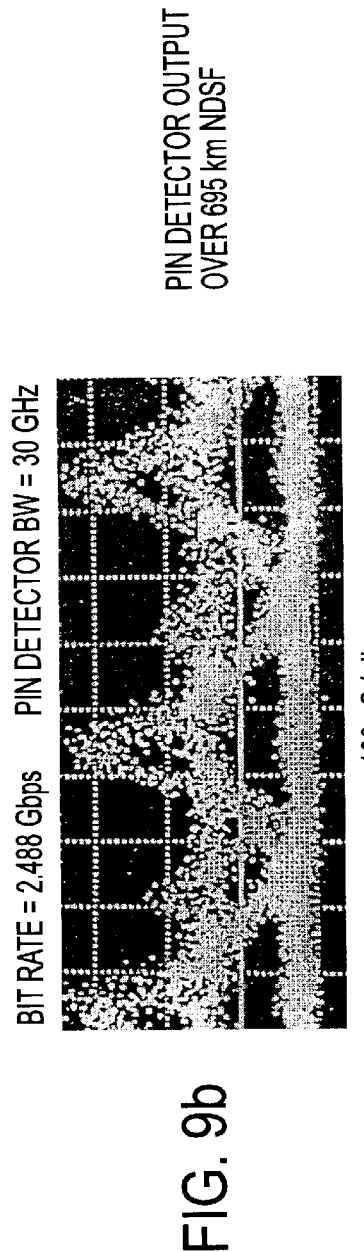
Figure 9C:
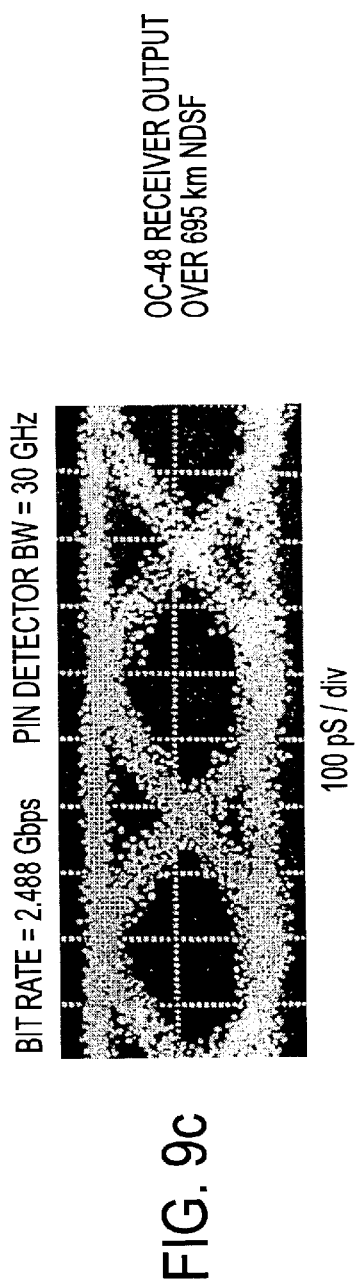

FIG. 9a shows a transmitted back to back output after the system 50 of FIG. 6a, and FIGS. 9b and 9c show corresponding eye diagrams after additional 695 km of non-dispersion-shifted fibers (NDSF) and after OC-48 receiver respectively received at 2.5 Gb/s. A wide opened eye diagram of FIG. 9a indicates a high quality of the transmitted signal. Some distortions are introduced into the signal after transmittance through the NDSF fiber as shown in FIG. 9b. The distortions are almost eliminated after putting the signal through the OC48 card including an equalizer match filter (FIG. 9c).

Figure 10:
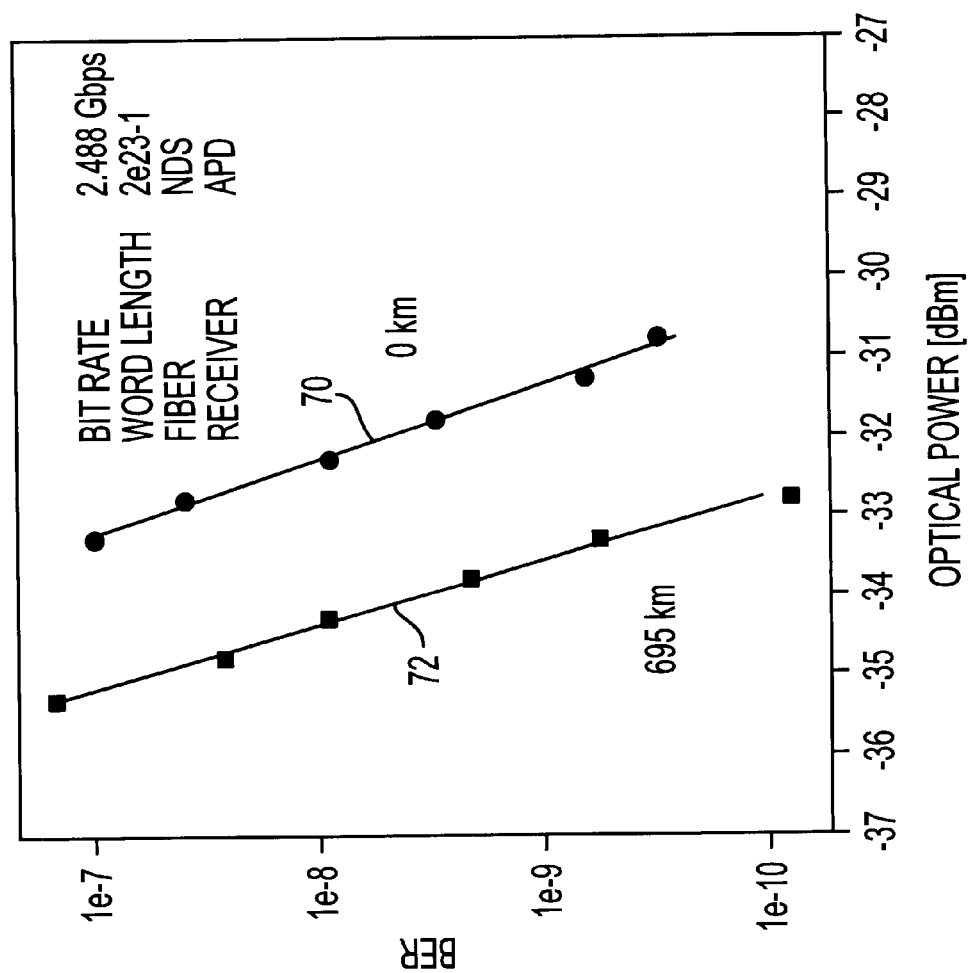
FIG. 10 is a bit-error-ratio plot for the system of FIG. 6a operating at 2.5 Gb/s.

FIG. 10 is a bit-error-rate plot for the system 50 of FIG. 6a operating at 2.5 Gb/s. Curves 70 and 72 illustrate plots measured right after the converter 52 and after additional 695 km of non-dispersion-shifted fiber respectively. It is seen that that the system 50 is capable of transmitting signals up to about 700 km without compromising their quality and providing sensitivity of the system up to −32.5 dB at 1e-10 BER.

Results similar to that described above and related to signal bit rates of 5 Gb/s and 10 Gb/s have-also been obtained, demonstrating similar quality and reliability of the system.

Thus, is has been demonstrated that the reflection modulation system 10 provides efficient frequency modulation of laser light and high quality intensity modulation of laser light when enhanced by the Fm to IM converter 52.

While the system 10 of the embodiment described above has been implemented by hybrid integration of the laser 12 and the modulation element 20, the alternative embodiment of the system may be designed by monolithic integration of the above two components. In the case of monolithic integration, the joint junction parts between the laser and the waveguide are preferred to be electrically isolated while optically self-aligned and well matched to avoid major reflections between the intermediate joined interfaces of the two components.

Additional modifications to the system 10 may include substitution of the DFB laser 12, having a grating formed by etching directly through the MQWs of the active region, by other known types of semiconductor lasers which would provide stable single wavelength operation within the required range of wavelength and modulation conditions. Other known filters for FM to IM conversion, e.g. MZ semiconductor interferometer or band pass filter, are also suitable to be used in the system 50 described above.

The reflection modulation system 10 of the invention offers many unique features over other known modulation systems. Since the passive waveguide is operated in reverse bias condition, there is virtually no current going through the junction of the waveguide and therefore there is practically no electrical power dissipation inside the core of the passive waveguide. Hence, the thermal problem associated with the direct modulation scheme and the other previously mentioned external modulation schemes can be completely eliminated. As a result, the system 10 provides much higher output power and avoids thermal and other types of frequency chirp. It is also more dispersion tolerant, and it is relatively easy to manufacture the system in large scale production ensuring high device yield for the system as a whole and its components. The system 10 can be used for narrow WDM channel spacing, e.g. down to 25 GHz, and for high speed and long distance, e.g. for 10 Gb/s and 200 km of NDS fibers. Additionally, the system 10 can offer 10~12 dB more of the output power fed into a fiber than widely used III–V MZ modulator based systems.

Thus, it will be appreciated that, while specific embodiments of the invention are described in detail above, numerous variations, modifications and combinations of these embodiments fall within the scope of the invention as defined in the following claims.

What is claimed is:

1. A compound cavity reflection modulation laser system for providing frequency modulation of output light generated therein, comprising:

a first cavity forming a single wavelength semiconductor laser between a front laser facet and a rear laser facet, said first cavity producing interference effects of a received phase modulated light to provide modulation of the complex reflection of said rear laser facet;

means for converting frequency modulation (FM) into intensity modulation (IM), said means being situated to receive output from said front facet of said laser; and a second cavity forming a phase modulation element between a front element facet and a rear element facet, said second cavity receiving light generated by said first cavity to provide said phase modulated light, said first and second cavities forming a compound cavity defined by said front laser facet and said rear element facet, wherein the modulation of said complex reflection of said rear laser facet provide frequency modulation of said output light.

2. A system as defined in claim 1, wherein the laser and the phase modulation element are monolithically integrated on the same chip.

3. A system as defined in claim 1, wherein the laser and the phase modulation element are hybrid integrated into the system.

4. A system as defined in claim 1, wherein the laser is a DFB laser.

5. A system as defined in claim 4, wherein the DFB laser is one of a gain-coupled laser and a loss-coupled laser.

6. A system as defined in claim 1, wherein each of the front element facet and the rear element facet is one of a cleaved facet and a high reflection coated facet.

7. A system as defined in claim 1, wherein each of the front element facet of the phase modulation element and the rear facet of the laser is one of an anti-reflection coated facet and a cleaved facet.

8. A system as defined in claim 1, wherein the means for FM to IM conversion comprises a Mach-Zehnder interferometer.

9. A system defined in claim 8, wherein the Mach-Zehnder interferometer is a fiber interferometer.

* * * * *